United States Patent
Chen et al.

(10) Patent No.: US 12,088,691 B2
(45) Date of Patent: Sep. 10, 2024

(54) CLOCK AND DATA RECOVERY CIRCUIT, METHOD AND APPARATUS

(71) Applicant: SHENZHEN PANGO MICROSYSTEMS CO., LTD., Shenzhen (CN)

(72) Inventors: Xinjian Chen, Shenzhen (CN); Yuanjun Liang, Shenzhen (CN)

(73) Assignee: SHENZHEN PANGO MICROSYSTEMS CO., LTD., Shenzhen (CN)

( * ) Notice: Subject to any disclaimer, the term of this patent is extended or adjusted under 35 U.S.C. 154(b) by 58 days.

(21) Appl. No.: 17/906,984

(22) PCT Filed: Mar. 24, 2021

(86) PCT No.: PCT/CN2021/082545
§ 371 (c)(1),
(2) Date: Sep. 22, 2022

(87) PCT Pub. No.: WO2022/095323
PCT Pub. Date: May 12, 2022

(65) Prior Publication Data
US 2023/0122734 A1    Apr. 20, 2023

(30) Foreign Application Priority Data
Nov. 5, 2020  (CN) .......................... 202011222770.2

(51) Int. Cl.
*H04L 7/00*  (2006.01)
*H03L 7/08*  (2006.01)
*H03L 7/085* (2006.01)

(52) U.S. Cl.
CPC .......... *H04L 7/0058* (2013.01); *H03L 7/0807* (2013.01); *H03L 7/085* (2013.01)

(58) Field of Classification Search
CPC ....... H03L 7/085; H03L 7/0807; H03L 7/091; H04L 7/0334; H04L 25/03885;
(Continued)

(56) References Cited

U.S. PATENT DOCUMENTS 9,350,572 B1 *  5/2016  Kang ...................... H04L 7/033
9,455,848 B1 *  9/2016  Zhang ............... H04L 25/03057
(Continued)

*Primary Examiner* — Aristocratis Fotakis
(74) *Attorney, Agent, or Firm* — Jeenam Park

(57) ABSTRACT

Disclosed are a clock and data recovery circuit, method and apparatus. The circuit comprises a receiving module for receiving an analog signal; a first equalization module connected to the receiving module, the first equalization module comprising a first totalizer and a second totalizer; a first sampling module connected to an output end of the first totalizer, the first sampling module comprising a first edge sampler and a second edge sampler that are connected to the output end of the first totalizer, respectively; a second sampling module connected to an output end of the second totalizer; a data processing module connected to both the first sampling module and the second sampling module; a clock recovery module connected to the data processing module; and an output module connected to the clock recovery module. In the present application, by means of the manner, a phase can be adjusted using a bias voltage, thereby accurately recovering clock information.

7 Claims, 9 Drawing Sheets

(58) Field of Classification Search
CPC ..... H04L 7/0058; H04L 7/033; H04L 7/0062; H04L 7/0087
See application file for complete search history.

(56) References Cited

U.S. PATENT DOCUMENTS

| | | | |
|---|---|---|---|
| 9,705,708 B1* | 7/2017 | Jin | H04L 25/03885 |
| 9,960,902 B1* | 5/2018 | Lin | H04L 7/033 |
| 10,181,941 B1* | 1/2019 | Chen | H04L 7/0062 |
| 2014/0177699 A1* | 6/2014 | Tan | H04L 25/03343 375/233 |
| 2016/0127155 A1* | 5/2016 | Johnson | H04L 25/03057 375/233 |
| 2017/0207779 A1* | 7/2017 | Chen | H03L 7/099 |
| 2018/0316524 A1* | 11/2018 | Cohen | H04L 25/03949 |

* cited by examiner

```
┌─────────────────────────────────────────────────────────────┐
│ Receiving an analog signal and perform equalization         │
│ processing on the analog signal to generate an              │
│ equalization signal                                         │
└─────────────────────────────────────────────────────────────┘
                              │
                              ▼
┌─────────────────────────────────────────────────────────────┐
│ Generating a first superimposed signal according to the     │
│ equalization signal and the first equalization coefficient, │
│ sampling the first superimposed signal, adjusting the       │
│ phase of the sampling result with the bias voltage, and     │
│ obtaining a first sampling data group                       │
└─────────────────────────────────────────────────────────────┘
                              │
                              ▼
┌─────────────────────────────────────────────────────────────┐
│ Generating a second superimposed signal according to the    │
│ first superimposed signal and the second equalization       │
│ coefficient, sampling the second superimposed signal and    │
│ obtaining a second sampling data group                      │
└─────────────────────────────────────────────────────────────┘
                              │
                              ▼
┌─────────────────────────────────────────────────────────────┐
│ Calculating the phase error according to the first sampling │
│ data group and the second sampling data group               │
└─────────────────────────────────────────────────────────────┘
                              │
                              ▼
┌─────────────────────────────────────────────────────────────┐
│ Obtaining the clock information, adjusting the phase of the │
│ clock signal according to the phase error calculation       │
│ result, and generating the clock information after phase    │
│ adjustment                                                  │
└─────────────────────────────────────────────────────────────┘
```

FIG.9

CLOCK AND DATA RECOVERY CIRCUIT, METHOD AND APPARATUS

FIELD OF THE INVENTION

This invention relates to the technical field of electronic circuits, in particular to a clock and data recovery circuit, method and apparatus.

BACKGROUND

Clock and data recovery (CDR) circuit is an important receiver (RX) component in the design (for example, high-speed serial input/output design) of serializer/deserializer (SerDes). In order to transmit serial data at a high speed, the CDR extracts phase information from the received serial data and generates a clock synchronized with the data, outputting a recovered clock and data signal for the RX component.

Whether the phase of the recovery clock can be in the best phase (i.e. the maximum eye width and eye height) is an important indicator of the quality of CDR. Phase detection consists of phase detectors, the difference between different CDRs depends on the phase detectors. The existing scheme can not fine tune the phase when the phase is not in the optimal position without decision feedback equalizer (DFE); In the case of DFE equalization, the phase is completely controlled by the phase detector, and the phase is not necessarily in the best position.

Therefore, it is necessary to provide a new clock and data recovery circuit, method and apparatus to solve the above technical defects.

SUMMARY

The invention provides a clock and data recovery circuit, method and apparatus, which can adjust the phase by using the positive bias voltage, so as to accurately recover the clock information.

In order to solve the above technical problems, a technical solution adopted in the invention is to provide a clock and data recovery circuit comprising:

a receiving module for receiving an analog signals;

a first equalization module connected to the receiving module, the first equalization module comprising a first totalizer and a second totalizer, the first totalizer receives the analog signal and a first equalization coefficient and generates a first superimposed signal, the second totalizer receives the first superimposed signal and a second equalization coefficient and generates a second superimposed signal;

a first sampling module connected to an output end of the first totalizer, the first sampling module comprising a first edge sampler and a second edge sampler that are connected to the output end of the first totalizer, respectively, the first edge sampler samples the first superimposed signal and adjusts the phase of the sampling result with a positive bias voltage to generate a first sampling data; the second edge sampler samples the first superimposed signal and adjusts the phase of the sampling result with a negative bias voltage to generate a second sampling data;

a second sampling module connected to an output end of the second totalizer, and the second sampling module is used for sampling the second superimposed signal;

a data processing module connected to both the first sampling module and the second sampling module, and the data processing module performs phase error detection according to the first sampling data, the second sampling data and the sampling results of the second sampling module;

a clock recovery module connected to the data processing module, the clock recovery module receives a clock signal, makes a phase adjustment for the clock signal according to a phase error detection result, and generate a clock information of the corresponding phase according to the phase adjustment result;

an output module connected to the clock recovery module, and the output module is used to output the clock information.

According to an embodiment of the invention, the circuit further comprises a second equalization module arranged between the receiving module and the first equalization module, the second equalization module comprising a continuous time linear equalizer and a variable gain amplifier, the continuous time linear equalizer receives the analog signal and generates a first equalization signal, and the variable gain amplifier receives the first equalization signal and generates a second equalization signal.

According to an embodiment of the invention, the second sampling module further comprises a data sampler and a third edge sampler respectively connected to the output end of the second totalizer, the third edge sampler samples the second superimposed signal and generates a third sampling data, and the data sampler samples the second superimposed signal and generates a fourth sampling data.

According to an embodiment of the invention, the data processing module further comprises a phase error detector connected to an output end of the first edge sampler, an output end of the second edge sampler, an output end of the data sampler and an output end of the third edge sampler, and a filter connected to the phase error detector, the phase error detector obtains a first error value according to the first sampling data and the second sampling data, obtains a second error value according to the third sampling data and the fourth sampling data, obtains a phase error is by summing the first error value and the second error value, and the filter performs digital filtering processing on the phase error.

According to an embodiment of the invention, the first edge sampler and the second edge sampler use the following formula for phase adjustment:

$$h0.5=h-0.5+h1.5+ofs; h0.5+h1.5=h-0.5+h1$$

Wherein, ofs is a positive bias voltage in the first edge sampler, ofs is a negative bias voltage in the second edge sampler, and h is a pulse response.

In order to solve the above technical problems, another technical scheme adopted in the invention is to provide a clock data recovery apparatus comprising the clock and data recovery circuit.

In order to solve the above technical problems, another technical solution adopted in the invention is to provide a clock data recovery method comprising:

receiving an analog signal and performing equalization processing on the analog signal to generate an equalization signal;

generating a first superimposed signal according to the equalization signal and a first equalization coefficient, sampling the first superimposed signal, and adjusting the phase of the sampling result by using the bias voltage to obtain a first sampling data group;

generating a second superimposed signal is generated according to the first superimposed signal and a second equalization coefficient, and sampling the second superimposed signal to obtain a second sampling data group;

calculating a phase error according to the first sampling data group and the second sampling data group; and acquiring clock information and performing phase adjustment on the clock signal according to a phase error calculation result to generate phase-adjusted clock information.

According to an embodiment of the invention, generating a first superimposed signal according to the equalization signal and a first equalization coefficient, sampling the first superimposed signal, and adjusting the phase of the sampling result by using the bias voltage to obtain a first sampling data group, further comprises:

performing edge sampling on the first superimposed signal, and adjusting the phase of the sampling result using the positive bias voltage to obtain a first sampling data; and performing edge sampling on the first superimposed signal, and adjusting the phase of the sampling result using the negative bias voltage to obtain a second sampling data.

According to an embodiment of the invention, generating a second superimposed signal according to the first superimposed signal and a second equalization coefficient, and sampling the second superimposed signal to obtain a second sampling data group, further comprises:

performing edge sampling on the second superimposed signal to obtain a third sampling data; and performing data sampling on the second superimposed signal to obtain a fourth sampling data.

According to an embodiment of the invention, calculating the phase error according to the first sampling data group and the second sampling data group, further comprises:

Obtaining a first error value according to the first sampling data, the second sampling data and a preset truth table;

obtaining a second error value according to the third sampling data, the fourth sampling data and the preset truth table;

obtaining a phase error by summing the first error value and the second error value.

The beneficial effects of the invention are that the phase can be adjusted and the phase of the recovery clock can be adjusted optimally so as to accurately recover the clock information by means of use of the first edge sampler to sample the first superimposed signal and adjustment of the phase of the sampling result via the positive bias voltage, and use of the second edge sampler to sample the first superimposed signal and adjustment of the phase of the sampling result via the negative bias voltage, after the output end of the first totalizer is connected to the first edge sampler and the second edge sampler under the circumstance of DFE equalization.

BRIEF DESCRIPTION OF THE DRAWINGS

FIG. 9 is a schematic flowchart of a clock data recovery method according to an embodiment of the invention.

DETAILED DESCRIPTION OF INVENTION

The technical solutions of the invention will be clearly and completely described below with reference to the drawings in the embodiments of the invention. Obviously, the described embodiments are only a part of the embodiments of the invention, not all of the embodiments. Based on the embodiments in the invention, all other embodiments obtained by ordinary technicians in the art without creative work should fall into the scope of protection of the invention.

The terms "first", "second" and "third" in this invention are only used for descriptive purposes and cannot be understood as indicating or implying relative importance or implicitly indicating the number of indicated technical features. Thus, the features defining "first", "second" and "third" may include at least one of the features explicitly or implicitly. In the description of this invention, "multiple" means at least two, such as two, three, etc. Unless otherwise expressly and specifically limited. In the embodiment of the invention, all directional indications (such as up, down, left, right, front, rear . . . ) are only used to explain the relative position relationship and movement between components under a specific attitude (as shown in the attached drawings). If the specific gesture changes, the directional indication will be changed accordingly. In addition, the terms "include" and "have" and any deformation thereof are intended to cover non exclusive inclusion. For example, a process, method, system, product or apparatus comprising a series of steps or units is not limited to the steps or units listed, but optionally also include steps or units not listed, or optionally include other steps or units inherent to these processes, methods, products or apparatuses.

Reference herein to an "embodiment" means that a particular feature, structure, or characteristic described in connection with the embodiment can be included in at least one embodiment of the invention. The phrase appearing in each position in the invention does not necessarily refer to the same embodiment, nor is it an independent or alternative embodiment mutually exclusive with other embodiments. Those skilled in the art explicitly and implicitly understand that the embodiments described herein can be combined with other embodiments.

Figure 1:
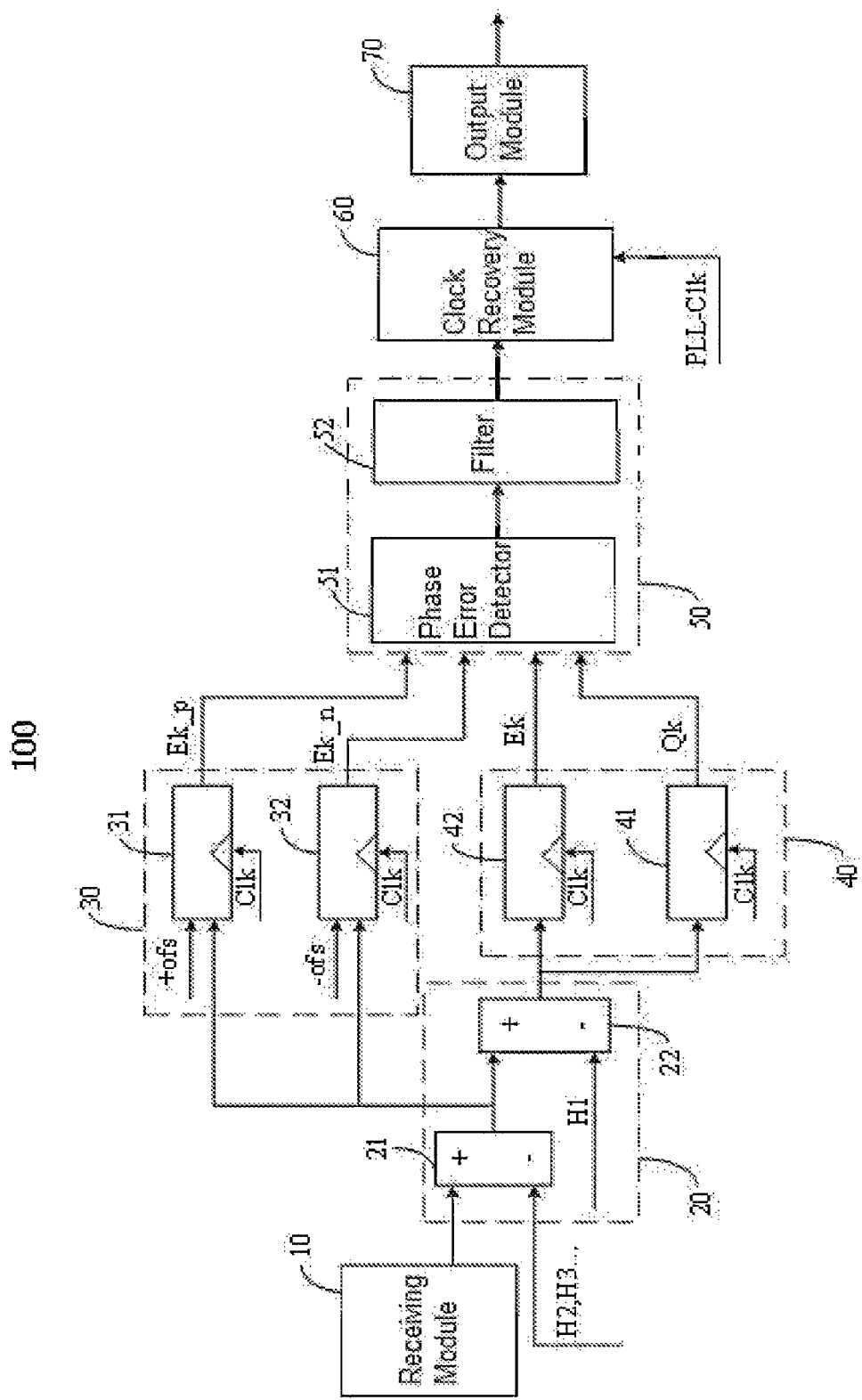
FIG. 1 is a structural diagram of a clock and data recovery circuit according to a first embodiment of the invention.

FIG. 1 is a structural diagram of the clock and data recovery circuit according to the first embodiment of the invention. Please refer to FIG. 1, the clock and data recovery circuit 100 comprises a receiving module 10, a first equalization module 20, a first sampling module 30, a second sampling module 40, a data processing module 50, a clock recovery module 60 and an output module 70. The receiving module 10 is used to receive analog signals, an input end of the first equalization module 20 is connected to the receiving module 10, an output end of the first equalization module 20 is connected to the first sampling module 30 and the second sampling module 40 respectively, an input end of the data processing module 50 is connected to an output end of the first sampling module 30 and an output end of the second sampling module 40, and an output end of the data processing module 50 is connected to an input end of the clock recovery module 60, an output end of the clock recovery module 60 is connected to an output end module 70.

Further, referring to FIG. 1, the first equalization module 20 comprises a first totalizer 21 connected to the receiving module 10 and a second totalizer 22 connected to the first totalizer 21, the first totalizer 21 receives the analog signal and the first equalization coefficient (H2, H3 . . . ) and superimposes the analog signal and the first equalization coefficient to generate the first superimposed signal, the second totalizer 22 receives the first superimposed signal and the second equalization coefficient (H1) and superimposes the first superimposed signal and the second equalization coefficient to generate a second superimposed signal.

The first equalization coefficient and the second equalization coefficient in this embodiment are the equalization coefficients of DFE, which are obtained by the equalization algorithm of DFE. Specifically, the DFE equalization in the first equalization module comprising two steps, the first step is the partial equalization without the second equalization coefficient H1, and the second step is the complete equalization with the second equalization coefficient H1.

Further, the first sampling module 30 comprises a first edge sampler 31 and a second edge sampler 32 which are respectively connected to an output end of the first totalizer 21. The first edge sampler 31 performs edge sampling on the first superimposed signal and adjusts the phase of the sampling result with a positive bias voltage to generate the first sampling data Ek_p; the second edge sampler 32 performs edge sampling on the first superimposed signal, and uses the negative bias voltage to phase adjust the sampling result to generate the second sampling data Ek_n.

The first edge sampler 31 uses the following formula for phase adjustment:

$$h0.5=h-0.5+h1.5+ofs; h0.5+h1.5=h-0.5+h1$$

Wherein, ofs is a positive bias voltage, h is a pulse response.

The second edge sampler 32 uses the following formula for phase adjustment:

$$h0.5=h-0.5+h1.5+ofs; h0.5+h1.5=h-0.5+h1$$

Wherein, ofs is a negative bias voltage, and h is a pulse response.

Further, the second sampling module 40 further comprises a data sampler 41 and a third edge sampler 42 which are respectively connected to an output end of the second totalizer 22. The third edge sampler 42 samples the second superimposed signal and generates a third sampling data Ek, and the data sampler 41 samples the second superimposed signal and generates the fourth sampling data Qk.

Figure 2:
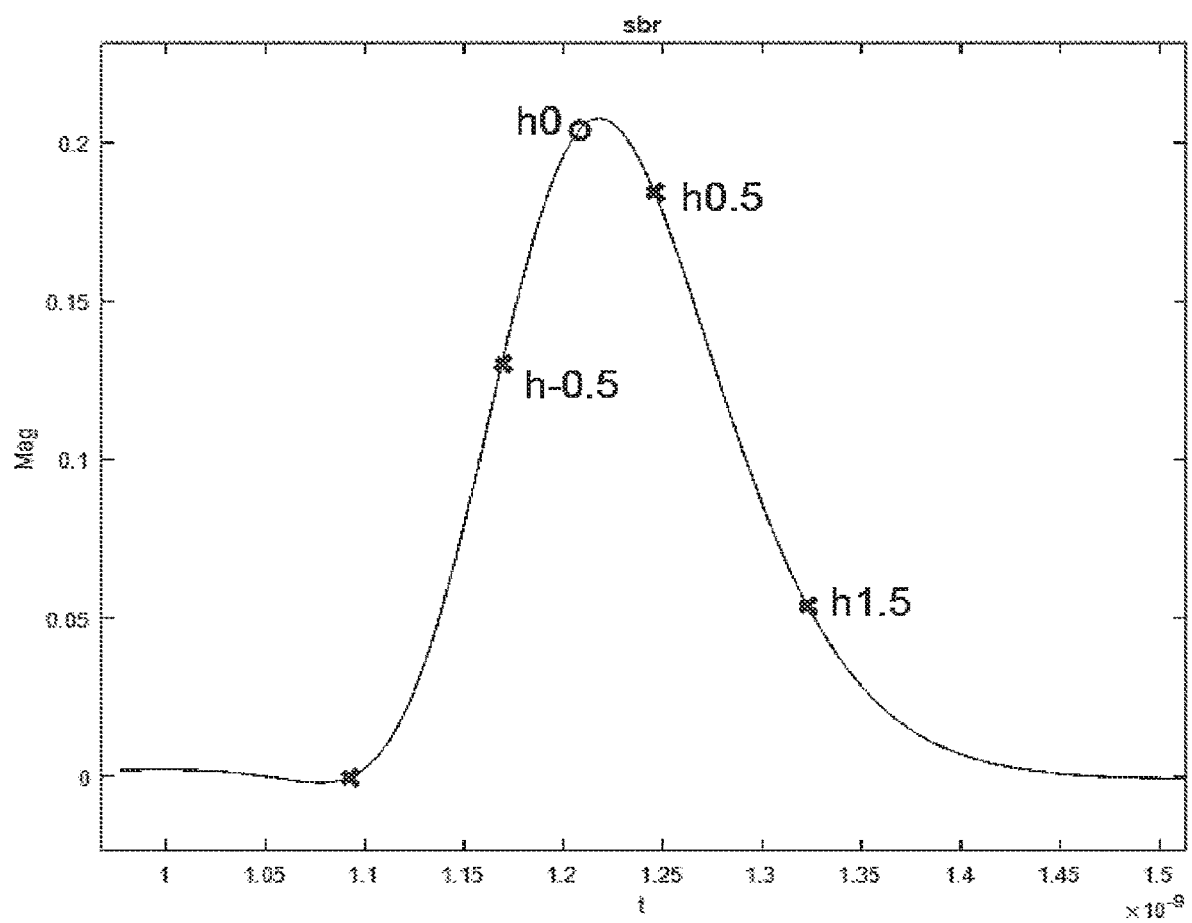
FIG. 2 is a conventional CDR convergence phase diagram.
Figure 3:
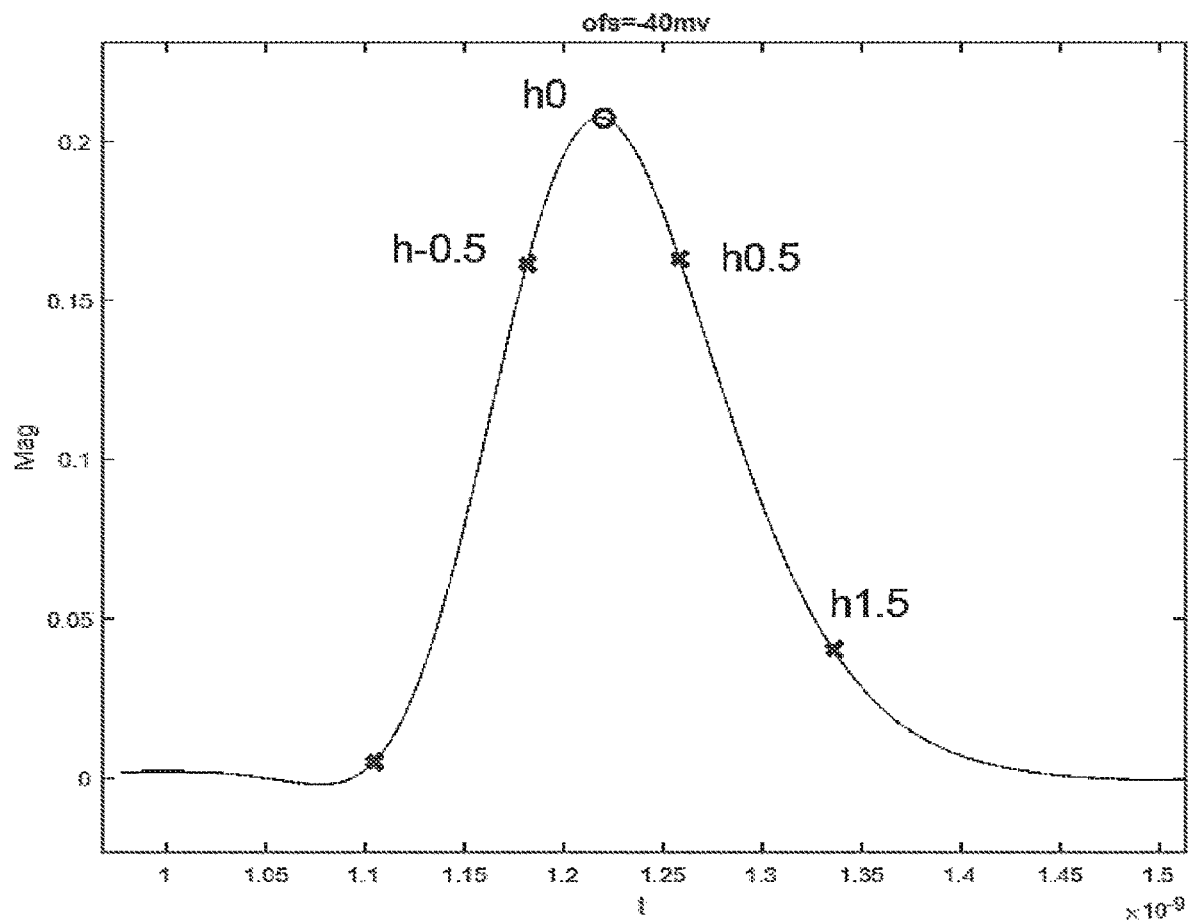
FIG. 3 is a phase adjustment diagram of ofs=−40 mv in the embodiment of the invention.
Figure 4:
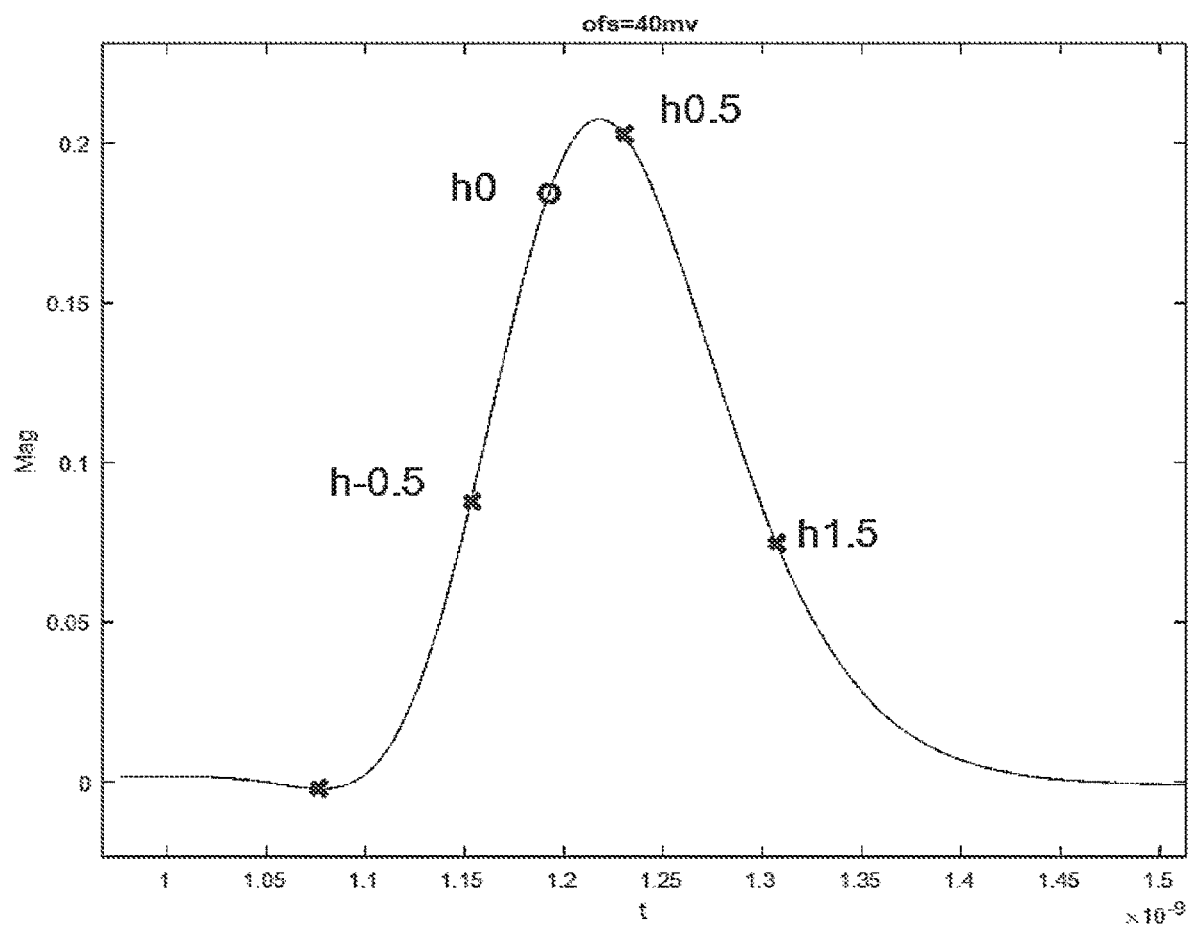
FIG. 4 is a phase adjustment diagram of ofs=+40 mv in the embodiment of the invention.
Figure 5:
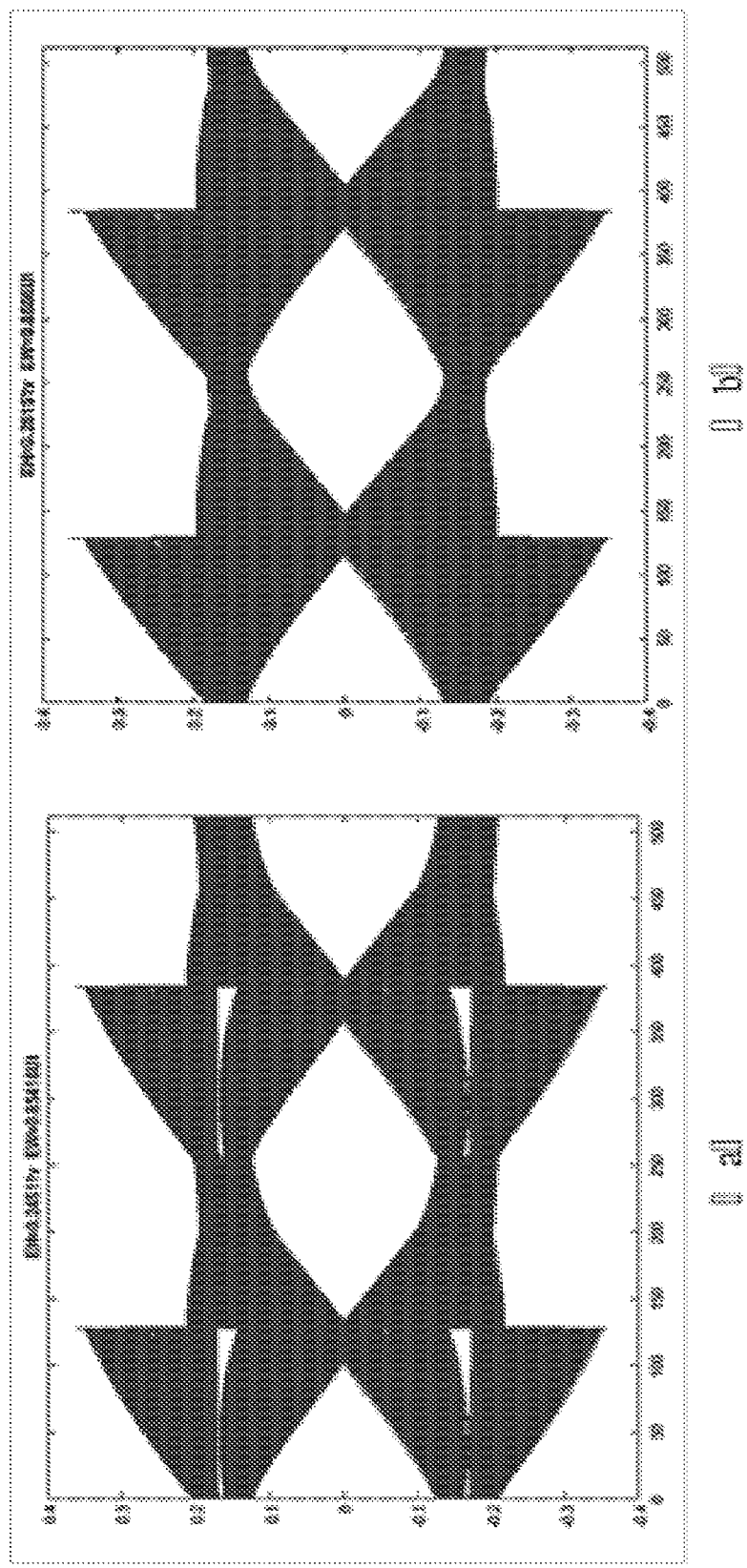
FIG. 5(a) is an eye diagram of the existing technology, (b) is an eye diagram after increasing the bias voltage in the embodiment of the invention.

The traditional scheme is to set an edge sampler after the first totalizer 21 and the second totalizer 22 respectively. In this embodiment, two edge samplers are set after the first totalizer 21, namely, the first edge sampler 31 and the second edge sampler 32, the two edge samplers have amplitude adjustable positive voltage bias and negative voltage bias respectively. The output digital signal of the first edge sampler 31 is defined as Ek_p, the output digital signal of the second edge sampler 32 is defined as Ek_n, Ek_p is the edge sampling data of positive voltage bias, Ek_n is the edge sampling data of negative voltage bias. In this embodiment, by adjusting the bias voltage and then adjusting the phase, the phase can be adjusted to the best position, so as to accurately recover the clock information, as shown FIG. 2 to FIG. 4, wherein, FIG. 2 is a conventional CDR convergence phase diagram, the abscissa is time t, the ordinate is impulse response h, and h0 is the data sampling point; FIG. 3 shows the phase adjustment diagram of ofs=−40 mv, the abscissa is time t, the ordinate is impulse response h, h0 is the data sampling point, and the sampling phase moves to the right, FIG. 4 shows the phase adjustment diagram of ofs=+40 mv, the abscissa is time t, the ordinate is impulse response h, h0 is the data sampling point, and the sampling phase shifts to the left. Compared with the traditional scheme, as shown in table 1, different bias voltages have an impact on eye width and eye height. As shown in FIG. 5, figure b shows the eye diagram after increasing the bias voltage. Compared with figure (a), adjusting the bias voltage can improve the eye height and eye width in the eye diagram, and the larger the eye height and eye width can achieve the lower bit error rate. In this embodiment, it can be determined whether the eye width and the eye height reach the maximum value according to the bit error rate, so as to determine whether the phase is adjusted to the best position.

Table 1 shows the simulation comparison of different ofs

| ofs | 0 | 0.01 | 0.02 | 0.03 | 0.04 | 0.05 |
|---|---|---|---|---|---|---|
| Eye height (mv) | 245 | 252 | 256 | 260 | 261 | 258 |
| Eye width (UI) | 0.85 | 0.87 | 0.89 | 0.9 | 0.89 | 0.87 |

Further, the data processing module 50 further comprises a phase error detector 51 connected to the outputs of the first edge sampler 31, the second edge sampler 32, the data sampler 41 and the third edge sampler 42, and a filter 52 connected to the phase error detector 51, the phase error detector 51 is based on the first sampling data Ek_p and the second sampling data Ek_n obtains the first error value err1, obtains the second error value err2 according to the third sampling data Qk and the fourth sampling data Ek, the phase error err is obtained by summing the first error value err1 and the second error value err2, and the filter 52 digitally filters the phase error err to reduce the digital noise, so as to improve the accuracy of time recovery information.

Figure 6:
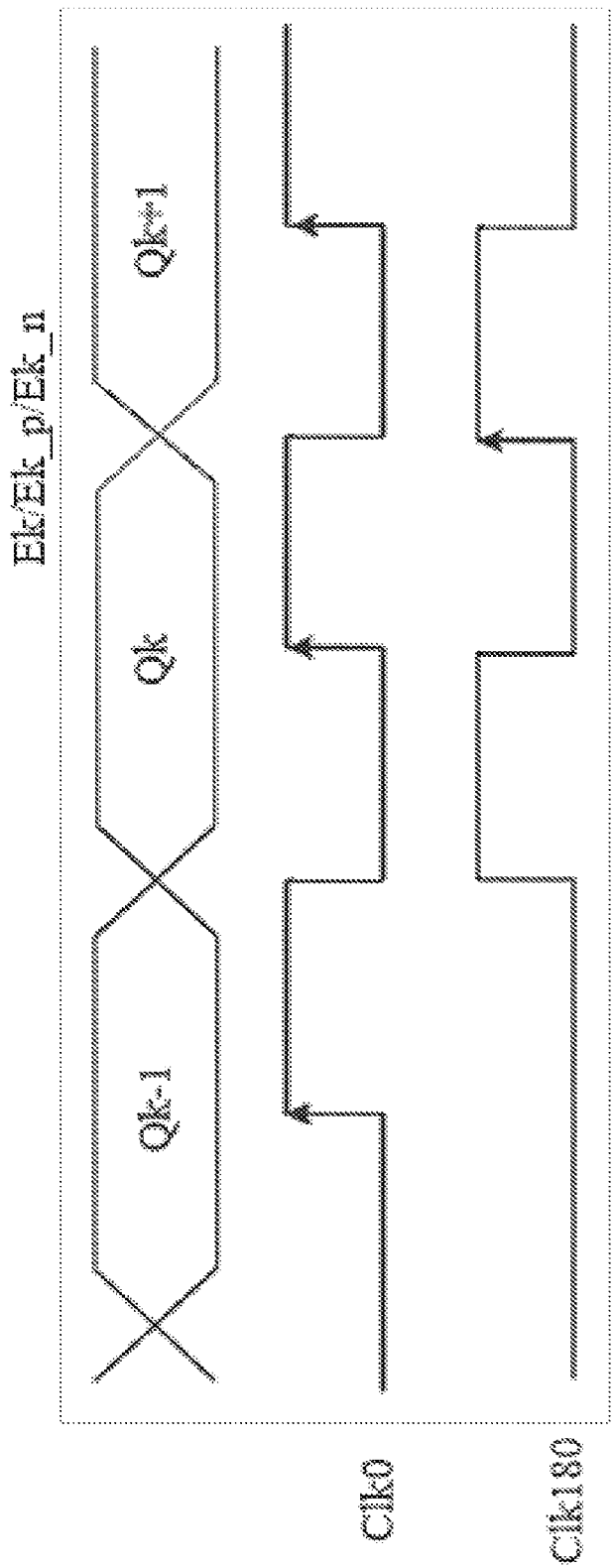
FIG. 6 is a diagram of the relationship between edge sampling data and sampling time in the embodiment of the invention.

Specifically, the phase error detector 51 sequentially marks the received first sampling data Ek_p, the second sampling data Ek_n, the third sampling data Qk and the fourth sampling data Ek, for example, Qk is the fourth sampling data of the current bit, Qk−1 is the fourth sampling data of the previous bit, Qk+1 is the fourth sampling data of the next bit, Ek/Ek_p/Ek_n is the edge sampling data at the intermediate time of Qk and Qk+1, as shown in FIG. 6.

With reference to the preset truth table, please refer to table 2, UP1 is obtained according to the first sampling data Ek_p, DN1 is obtained according to the second sampling data Ek_n; UP2 is obtained according to the third sampling data Qk, and DN2 is obtained according to the fourth sampling data Ek. The first error value err1 is the difference between UP1 and DN1, namely: err1=UP1−DN1, the second error value err2 is the difference between UP2 and DN2, namely: err2=UP2−DN2, and the phase error err is the sum of the first error value err1 and the second error value err2, namely: err1+err2. The filter 52 digitally filters the phase error err and outputs the digitally filtered phase error to the clock recovery module 60. The clock recovery module 60 receives the clock signal, the clock signal is phase adjusted according to a phase error detection result, generate a clock information of the corresponding phase according to the phase adjustment result, and the output module 70 outputs the clock information.

| Qk − 1 | Qk | Ek_p | Qk + 1 | UP1 | DN1 |
|---|---|---|---|---|---|
| 0 | 1 | 0 | 0 | 0 | 1 |
| 0 | 1 | 0 | 1 | 1 | 0 |
| 0 | 1 | 1 | 0 | 1 | 0 |
| 0 | 1 | 1 | 1 | 0 | 0 |

| Qk − 1 | Qk | Ek_n | Qk + 1 | UP1 | DN1 |
|---|---|---|---|---|---|
| 1 | 0 | 0 | 0 | 0 | 0 |
| 1 | 0 | 0 | 1 | 1 | 0 |
| 1 | 0 | 1 | 0 | 1 | 0 |
| 1 | 0 | 1 | 1 | 0 | 1 |

| Qk − 1 | Qk | Ek | Qk + 1 | UP2 | DN2 |
|---|---|---|---|---|---|
| 1 | 1 | 0 | 0 | 0 | 1 |
| 1 | 1 | 0 | 1 | 1 | 0 |
| 1 | 1 | 1 | 0 | 1 | 0 |
| 1 | 1 | 1 | 1 | 0 | 0 |
| 0 | 0 | 0 | 0 | 0 | 0 |
| 0 | 0 | 0 | 1 | 1 | 0 |
| 0 | 0 | 1 | 0 | 1 | 0 |
| 0 | 0 | 1 | 1 | 0 | 1 |

In the case of DFE equalization, the clock and data recovery circuit 100 of the first embodiment of the invention connects the first edge sampler 31 and the second edge sampler 32 at the output end of the first totalizer 21, uses the first edge sampler 31 to sample the first superimposed signal, uses the positive bias voltage to adjust the phase of the sampling result, uses the second edge sampler 32 to sample the first superimposed signal, and uses the negative bias voltage to adjust the phase of the sampling result, It can adjust the phase and adjust the phase of the recovery clock to the best, so as to accurately recover the clock information.

Figure 7:
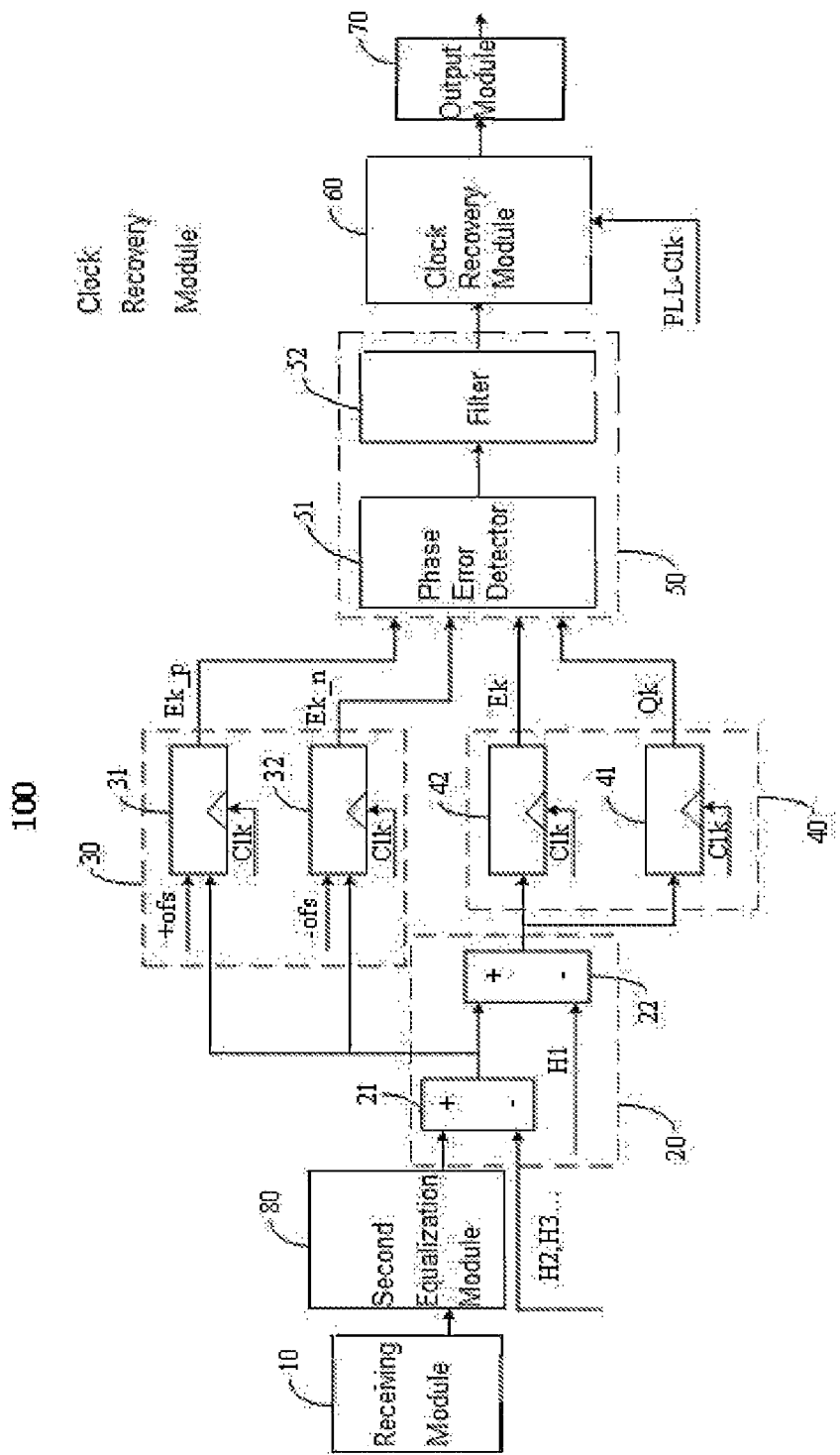
FIG. 7 is a structural diagram of a clock and data recovery circuit according to the second embodiment of the invention.

In another embodiment, please refer to FIG. 7, which is a structural diagram of the clock and data recovery circuit of the second embodiment of the invention. The clock and data recovery circuit 100 further comprising a second equalization module 80 arranged between the receiving module 10 and the first equalization module 20, the second equalization module 80 comprising a continuous time linear equalizer (not shown in the figure) connected to the input module 10 and a variable gain amplifier (not shown in the figure) connected to the continuous time linear equalizer, the output end of the variable gain amplifier is connected to the first totalizer 21, the continuous time linear equalizer receives the analog signal and generates the first equalization signal, the variable gain amplifier receives the first equalization signal and generates a second equalization signal, the first totalizer 21 receives the second equalization signal and the first equalization coefficient and generates a first superposition signal.

Based on the first embodiment, the clock and data recovery circuit 100 of the second embodiment of the invention can enhance the signal strength and further improve the accuracy of recovering clock information by performing continuous time linear equalization and signal amplitude adjustment on the received analog signal.

Figure 8:
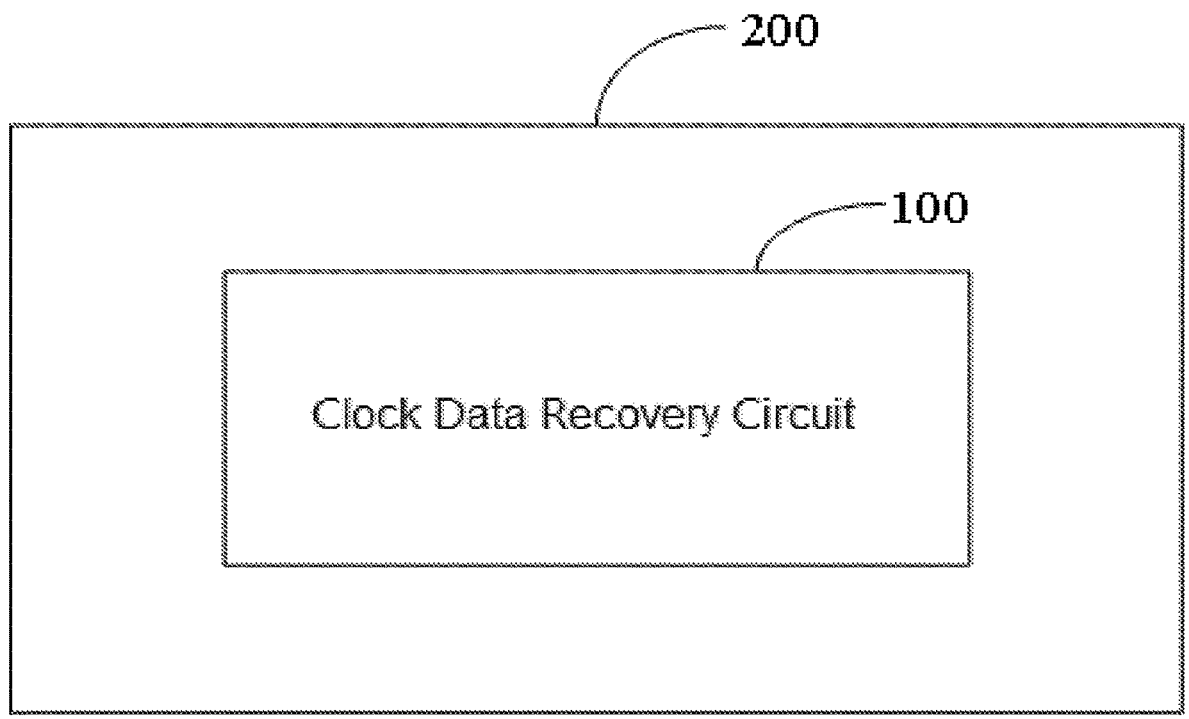
FIG. 8 is a structural diagram of a clock data recovery apparatus according to an embodiment of the invention.

FIG. 8 is a structural diagram of a clock data recovery apparatus according to the embodiment of the invention. Please refer to FIG. 8. The clock data recovery apparatus 200 comprises the aforementioned clock and data recovery circuit 100.

In this embodiment, the clock data recovery apparatus 200 using the clock and data recovery circuit 100 can adjust the phase by using the bias voltage, and can adjust the phase of the recovery clock to the best, so as to accurately recover the clock information.

FIG. 9 is a schematic flowchart of a clock data recovery method according to an embodiment of the invention. It should be noted that if there are substantially the same results, the method of the invention is not limited to the process sequence shown in FIG. 9. As shown in FIG. 9, the method comprising the following steps:

Step S901: receiving an analog signal and performing equalization processing on the analog signal to generate an equalization signal.

In step S901, the analog signal is first equalized by a continuous time linear equalizer to generate a first equalized signal; then, the first equalization signal adjusts the signal amplitude through the variable gain amplifier to generate a second equalization signal.

Step S902: generating a first superimposed signal according to the equalization signal and the first equalization coefficient, sampling the first superimposed signal, phase adjust the sampling result with the bias voltage, and obtaining a first sampling data group.

In step S902, the first equalization coefficient is the equalization coefficient of DFE, which is obtained by the equalization algorithm of DFE. Further, the step further comprises edge sampling the first superimposed signal, adjusting the phase of the sampling result using the positive bias voltage to obtain a first sampling data; the first superimposed signal being edge sampled, and the negative bias voltage being used to adjust the phase of the sampling result to obtain the second sampling data. The specific method of phase adjustment in this embodiment has been described in detail above, and will not be repeated here one by one.

Step S903: generating a second superimposed signal according to the first superimposed signal and the second equalization coefficient, sampling the second superimposed signal and obtaining a second sampling data group.

In step S903, the second equalization coefficient is the equalization coefficient of DFE, which is obtained by the equalization algorithm of DFE. Further, the step further comprises edge sampling the second superimposed signal to obtain the third sampling data; the second superimposed signal being sampled to obtain the fourth sampling data.

Step S904: calculating the phase error according to the first sampling data group and the second sampling data group.

In step S904, the first error value can be obtained according to the first sampling data, the second sampling data and the preset truth table; the second error value can be obtained according to the third sampling data, the fourth sampling data and the preset truth table; and then a phase error can be obtained by summing the first error value and the second error value. The specific calculation methods of the first error difference, the second error difference and the phase error of this embodiment have been described in detail above, and will not be repeated here one by one.

Step S905: obtaining the clock information, adjusting the phase of the clock signal according to the phase error calculation result, and generating the clock information after phase adjustment.

The clock data recovery method of the invention adjusts the phase by using the bias voltage, and can adjust the phase of the recovery clock to the best, so as to accurately recover the clock information.

The above is only the implementation mode of the invention and does not limit the scope of the invention. All equivalent structure or equivalent process transformations made by using the contents of the description and attached drawings of the invention, or directly or indirectly applied in other relevant technical fields, are similarly included in the scope of protection of the invention.

What is claimed is:

1. A clock and data recovery circuit comprising:
a receiving module for receiving an analog signal;
a first equalization module connected to the receiving module, the first equalization module comprising a first totalizer for receiving the analog signal and a first equalization coefficient and generating a first superimposed signal, and a second totalizer for receiving the first superimposed signal and a second equalization coefficient and generating a second superimposed signal;
a first sampling module connected to an output end of the first totalizer, the first sampling module comprising a first edge sampler for sampling the first superimposed signal and adjusting a phase of a sampling result with a positive bias voltage to generate a first sampling data and a second edge sampler for sampling the first superimposed signal and adjusting a phase of a sampling result with a negative bias voltage to generate a second sampling data, which are connected to the output end of the first totalizer respectively;
a second sampling module connected to an output end of the second totalizer for sampling the second superimposed signal;
a data processing module connected to both the first sampling module and the second sampling module, the data processing module performing phase error detection according to the first sampling data, the second sampling data and a sampling results of the second sampling module;
a clock recovery module connected to the data processing module, the clock recovery module receiving a clock signal and making a phase adjustment for the clock signal according to a phase error detection result, so as to generate a clock information corresponding to the phase according to a phase adjustment result; and
an output module for outputting the clock information connected to the clock recovery module;
the second sampling module further comprises a data sampler and a third edge sampler respectively connected to the output end of the second totalizer, the third edge sampler sampling the second superimposed signal and generating a third sampling data, and the data sampler sampling the second superimposed signal and generating a fourth sampling data;
the data processing module further comprises a phase error detector connected to an output end of the first edge sampler, an output end of the second edge sampler, an output end of the data sampler and an output end of the third edge sampler, and a filter connected to the phase error detector; and wherein the phase error detector obtains a first error value according to the first sampling data and the second sampling data, obtains a second error value according to the third sampling data and the fourth sampling data, obtains a phase error by summing the first error value and the second error value, and the filter performs digital filtering processing on the phase error.

2. The clock and data recovery circuit according to claim 1, wherein the circuit further comprises a second equalization module arranged between the receiving module and the first equalization module, in which the second equalization module comprising a continuous time linear equalizer receiving the analog signal and generating a first equalization signal and a variable gain amplifier receiving the first equalization signal and generating a second equalization signal.

3. The clock and data recovery circuit according to claim 1, wherein the first edge sampler use the following formula for phase adjustment:

$$h0.5=h-0.5+h1.5+ofs; h0.5+h1.5=h-0.5+h1$$

ofs is the positive bias voltage, and h is a pulse response;
the second edge sampler use the following formula for phase adjustment:

$$h0.5=h-0.5+h1.5+ofs; h0.5+h1.5=h-0.5+h1$$

ofs is the negative bias voltage in the second edge sampler, and h is a pulse response.

4. A clock data recovery apparatus comprising a clock and data recovery circuit which comprises:
a receiving module for receiving an analog signal;
a first equalization module connected to the receiving module, the first equalization module comprising a first totalizer for receiving the analog signal and a first equalization coefficient and generating a first superimposed signal, and a second totalizer for receiving the first superimposed signal and a second equalization coefficient and generating a second superimposed signal;
a first sampling module connected to an output end of the first totalizer, the first sampling module comprising a first edge sampler for sampling the first superimposed signal and adjusting a phase of a sampling result with a positive bias voltage to generate a first sampling data and a second edge sampler for sampling the first superimposed signal and adjusting a phase of a sampling result with a negative bias voltage to generate a second sampling data, which are connected to the output end of the first totalizer respectively;
a second sampling module connected to an output end of the second totalizer for sampling the second superimposed signal;
a data processing module connected to both the first sampling module and the second sampling module, the data processing module performing phase error detection according to the first sampling data, the second sampling data and a sampling results of the second sampling module;
a clock recovery module connected to the data processing module, the clock recovery module receiving a clock signal and making a phase adjustment for the clock signal according to a phase error detection result, so as to generate a clock information corresponding to the phase according to a phase adjustment result; and
an output module for outputting the clock information connected to the clock recovery module;
the second sampling module further comprises a data sampler and a third edge sampler respectively connected to the output end of the second totalizer, the third edge sampler sampling the second superimposed signal and generating a third sampling data, and the data sampler sampling the second superimposed signal and generating a fourth sampling data;
the data processing module further comprises a phase error detector connected to an output end of the first edge sampler, an output end of the second edge sampler, an output end of the data sampler and an output end of the third edge sampler, and a filter connected to the phase error detector; and wherein the phase error detector obtains a first error value according to the first sampling data and the second sampling data, obtains a second error value according to the third sampling data and the fourth sampling data, obtains a phase error by summing the first error value and the second error value, and the filter performs digital filtering processing on the phase error.

5. The clock and data recovery circuit according to claim 4, wherein the circuit further comprises a second equalization module arranged between the receiving module and the first equalization module, in which the second equalization module comprising a continuous time linear equalizer receiving the analog signal and generating a first equalization signal and a variable gain amplifier receiving the first equalization signal and generating a second equalization signal.

6. The clock and data recovery circuit according to claim 4, wherein the first edge sampler use the following formula for phase adjustment:

$$h0.5=h-0.5+h1.5+ofs; h0.5+h1.5=h-0.5+h1$$

ofs is the positive bias voltage, and h is a pulse response; the second edge sampler use the following formula for phase adjustment:

$$h0.5=h-0.5+h1.5+ofs; h0.5+h1.5=h-0.5+h1$$

ofs is the negative bias voltage, and h is a pulse response.

7. A clock data recovery method, comprising:
receiving an analog signal and performing equalization processing on the analog signal to generate an equalization signal;
generating a first superimposed signal according to the equalization signal and a first equalization coefficient, sampling the first superimposed signal, and adjusting the phase of a sampling result using a bias voltage to obtain a first sampling data group;
generating a second superimposed signal according to the first superimposed signal and a second equalization coefficient, and sampling the second superimposed signal to obtain a second sampling data group;
calculating a phase error according to the first sampling data group and the second sampling data group; and
acquiring clock information and performing phase adjustment on the clock signal according to a phase error calculation result to generate phase-adjusted clock information;
the step of generating a first superimposed signal according to the equalization signal and a first equalization coefficient, sampling the first superimposed signal, and adjusting the phase of the sampling result using the bias voltage to obtain a first sampling data group further comprises:
performing edge sampling on the first superimposed signal, and adjusting the phase of the sampling result using a positive bias voltage to obtain a first sampling data; and
performing edge sampling on the first superimposed signal, and adjusting the phase of the sampling result using a negative bias voltage to obtain a second sampling data;
the step of generating a second superimposed signal according to the first superimposed signal and a second equalization coefficient, and sampling the second superimposed signal to obtain a second sampling data group further comprises:
performing edge sampling on the second superimposed signal to obtain a third sampling data; and
performing data sampling on the second superimposed signal to obtain a fourth sampling data;
the step of calculating a phase error according to the first sampling data group and the second sampling data group, further comprises:
obtaining a first error value according to the first sampling data, the second sampling data and a preset truth table;
obtaining a second error value according to the third sampling data, the fourth sampling data and the preset truth table; and
obtaining a phase error by summing the first error value and the second error value.

* * * * *